United States Patent [19]

Nix et al.

[11] Patent Number: 5,077,474

[45] Date of Patent: * Dec. 31, 1991

[54] THERMAL IMAGING DEVICE

[75] Inventors: Elvin L. Nix, Windsor; Alastair Sibbald, Maidenhead; Stanley Taylor, Sunbury-on-Thames, all of England

[73] Assignee: Thorn EMI plc, London, England

[*] Notice: The portion of the term of this patent subsequent to Jul. 31, 2007 has been disclaimed.

[21] Appl. No.: 447,135

[22] Filed: Dec. 8, 1989

[30] Foreign Application Priority Data

Dec. 20, 1988 [GB] United Kingdom ............... 8829685

[51] Int. Cl.⁵ ............................................. G01J 5/06
[52] U.S. Cl. ................................. 250/332; 250/338.3
[58] Field of Search .................... 250/338.3, 332, 330, 250/349

[56] References Cited

U.S. PATENT DOCUMENTS

| | | | |
|---|---|---|---|
| 4,532,424 | 7/1985 | Cheung | 250/338 |
| 4,722,612 | 2/1988 | Junkert et al. | 374/124 |
| 4,847,500 | 7/1989 | Pedder et al. | 250/338.3 |
| 4,894,544 | 1/1990 | Turnbull | 250/338.3 |
| 4,945,240 | 7/1990 | Nix et al. | 250/338.3 |

FOREIGN PATENT DOCUMENTS 61-66129 4/1986 Japan .

Primary Examiner—Carolyn E. Fields
Assistant Examiner—James E. Boyer
Attorney, Agent, or Firm—Fleit, Jacobson, Cohn, Price, Holman & Stern

[57] ABSTRACT

A thermal imaging device includes an array of pyroelectric detector elements, supported by an array of pillars, the pillars also being effective to enable the passage of electrical signals between the detector elements and an electrical signal processing means. Each pillar is separated from a respective detector electrode by an elongate electrically conductive strip. The device includes areas of infra-red absorbant material effective to conduct heat from non-electroded parts of the device into adjacent pyroelectric detector elements.

7 Claims, 5 Drawing Sheets

SECTION AT C-C'

SECTION AT B-B'

SECTION AT C-C'

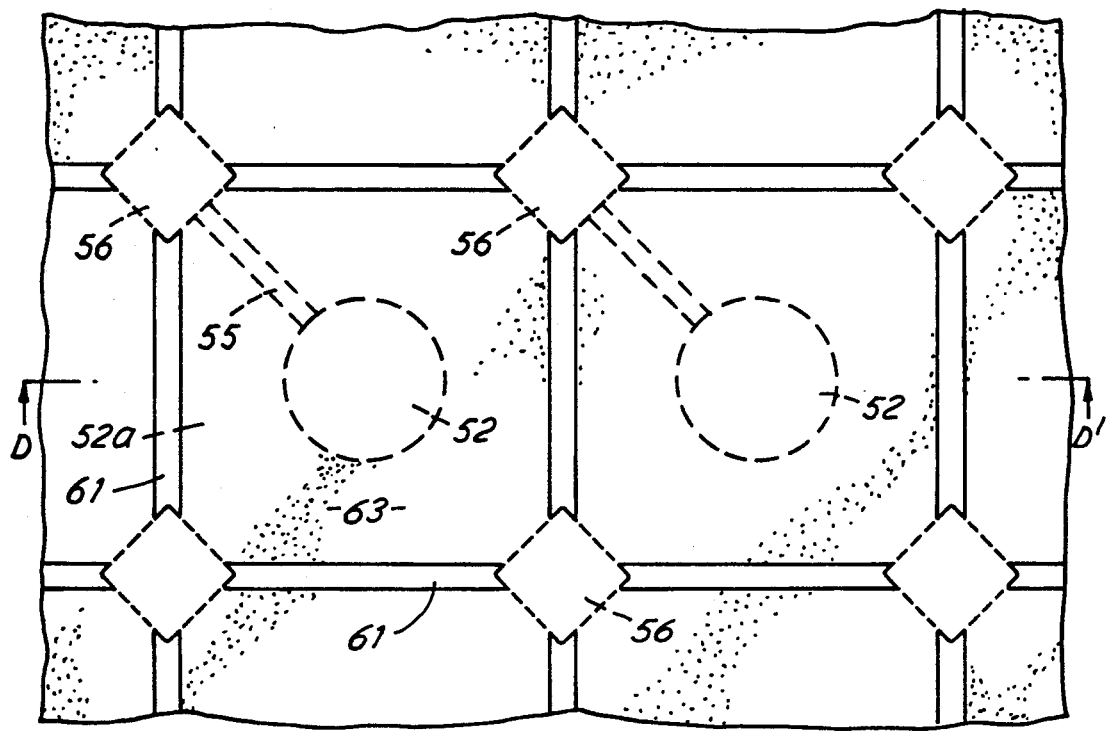
FIG. 12
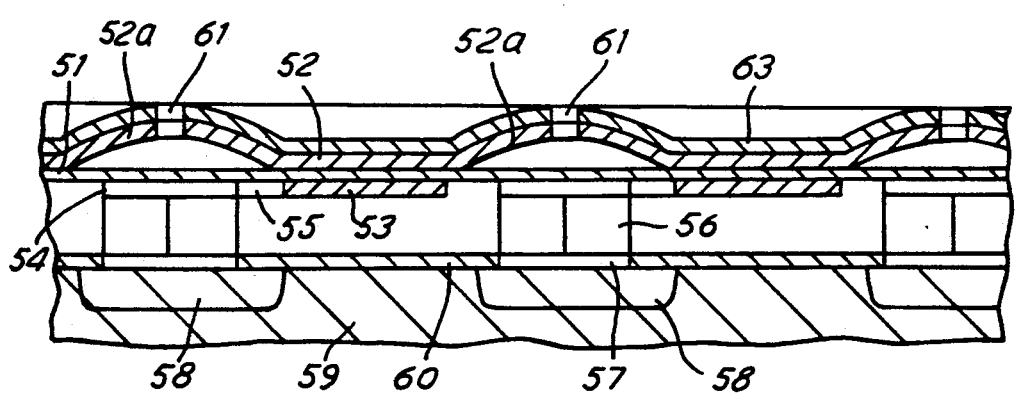
FIG. 13 SECTION AT D-D'

THERMAL IMAGING DEVICE

BACKGROUND OF THE INVENTION

This invention relates to thermal imaging devices and in particular to thermal imaging devices comprising an array of pyroelectric detector elements responsive to infra-red radiation.

the main factor limiting the performance of existing thermal imaging devices is the thermal conductance between adjacent detector elements and between each detector element and the supporting and interrogating structure.

In our copending European Patent Application Nos. 89305494 and 89305496 there are described thermal imaging devices which are designed in such a way as to reduce the thermal conductance between the detector elements and the supporting and interrogating structure. These devices will now be described with reference to FIGS. 1 to 3 and 4 and 5 of the accompanying figures in which:

FIG. 1 shows a plan view of part of the electrode structure of the device described in European Patent Application No. 89305494;

FIG. 2 shows a plan view of part of a surface of the device shown in FIG. 1, and FIG. 3 shows a section along the line A—A' of the device of FIGS. 1 and 2;

FIG. 4 shows a plan view of part of a surface of a device described in European Patent Application No. 89305496; and FIG. 5 shows a section along the line B—B' of the device of FIG. 4. Referring to FIGS. 1 to 5 in which corresponding features are correspondingly labelled a pyroelectric film 1 has an array of interconnected electrodes 2 formed on one side and an array of discrete electrodes 3 formed on the other side. Electrically conductive pads 4 are connected by long thin conductors 5 to the discrete electrodes 3 and by electrically conductive pillars 6 to input pads 7 of an integrated signal processing circuit located adjacent to the input pads of electrical circuits formed in regions 8 of a silicon wafer 9. The input pads 7 are separated by regions 10 of a passivating layer of an insulating material, for example silicon monoxide. In the arrangement of FIGS. 1 to 3 each discrete electrode 3, as best seen in FIG. 1, is square shaped with a central gap 11 in which the pad 4 lies. The long, narrow conductor 5 extends around the pad 4 within the gap 11. The interconnected electrodes 2, as best seen in FIG. 2 each have a central hole 12 corresponding to the gap 11 in the respective discrete electrode 3 and may carry an infra-red absorption layer 13, consisting of, for example, black gold, platinum black or a metal-dielectric-metal sandwich structure.

Referring now to FIGS. 4 and 5, in the device illustrated in these figures the discrete electrodes 3 are spaced from respective electrically conductive pads 4 and connected to them by long narrow conductors 5. The pillars are attached to respective electrically conductive pads 4, each of which lies centrally disposed with respect to several (in the case illustrated four) adjacent discrete electrodes 3. The interconnected electrodes 2 are in positions corresponding to the discrete electrodes 3 and again carry an appropriate infra-red absorption layer 13.

Both arrangements shown in FIGS. 1 to 5 provide a low, thermal conductance from the active areas of the discrete electrodes 3 to the pillars 6 because the electrical connection between the electrodes 3 and pillars 6 includes the long narrow conductor 5. However, both arrangements involve significant areas either within (in the device illustrated in FIGS. 1-3) or around (in the device illustrated in FIGS. 4 and 5) the discrete electrodes 3 where the incident radiation is wasted and consequently the signal to noise ratio of the device is reduced. In the device illustrated in FIGS. 4 and 5 the discrete electrodes 3 could be brought closer together by meandering the conductor 5, as proposed in European Patent Application No. 89305496 but there would still be significant incident radiation wasted at and around the pads 4.

It is an object of the present invention to provide a thermal imaging device of the type described in our copending European Patent Application Nos. 89305494 and 89305496 but wherein substantially the whole area of the pyroelectric film may be utilized to produce signals.

SUMMARY OF THE INVENTION

According to the present invention a thermal imaging device comprises: a layer comprising pyroelectric material; an array of interconnected electrodes carried on one major surface of the layer; an array of discrete electrodes carried on the other major surface of the layer so as to define with the interconnected electrodes an array of pyroelectric detector elements; a plurality of pillars effective to support the layer, and to enable the passage of electrical signals between the detector element and an electrical signal processing means, each pillar being electrically connected to a discrete electrode by an elongate strip of electrically conductive material which extends over a region of the layer which carries no electrodes, the device being characterized in that said one major surface of the layer carries areas of infra-red absorbant material which extend into said regions carrying no electrode, said areas being effective to conduct heat from each region to the adjacent pyroelectric detector element.

The areas of infra-red absorbant material suitably comprise extensions of the interconnected electrodes arranged to overhang said regions out of electrical contact with the regions. In such an arrangement the interconnected electrodes and their extensions preferably carry infra-red absorbing layers.

BRIEF DESCRIPTION OF THE DRAWINGS

Two devices in accordance with the invention will now be described by way of example only with reference to the accompanying figures, of which:

FIG. 12 shows a plan view of part of a surface of a second device in accordance with the invention; and FIG. 13 is a section along the line D—D' of the device shown in FIG. 12.

DETAILED DESCRIPTION OF THE INVENTION

Figure 1:
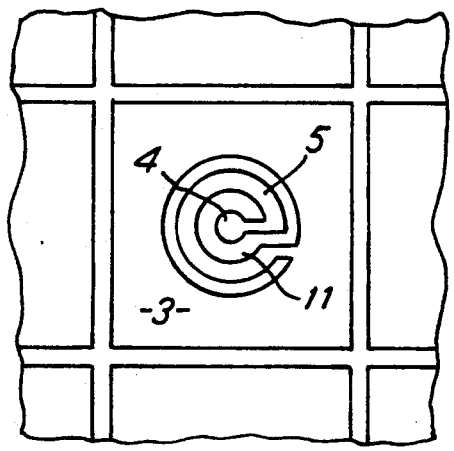
FIGS. 1 to 5 show the prior art arrangements already described.
Figure 2:
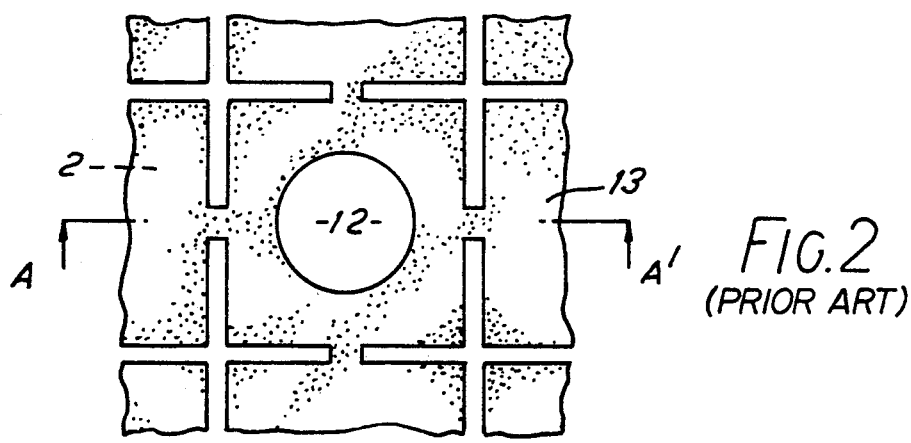
Figure 3:
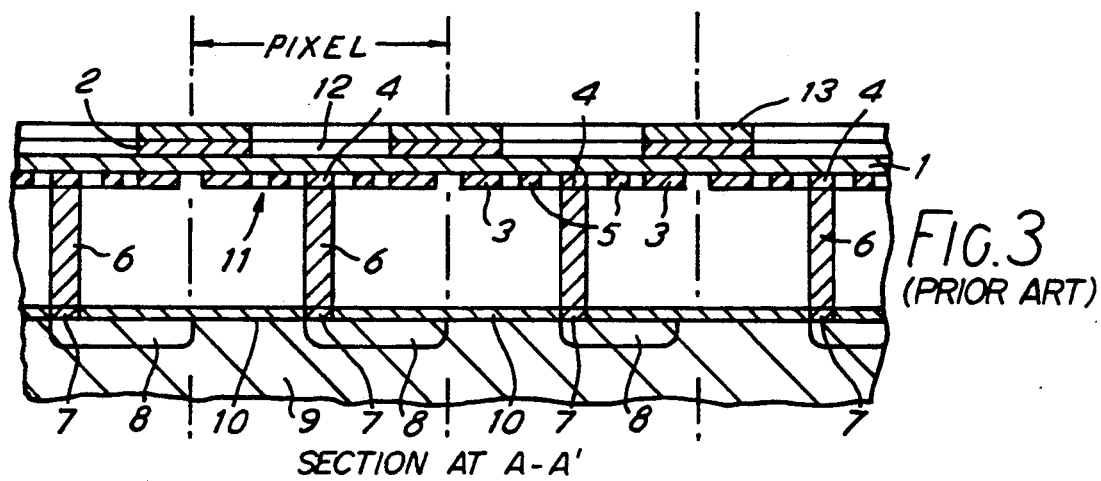
Figure 6:
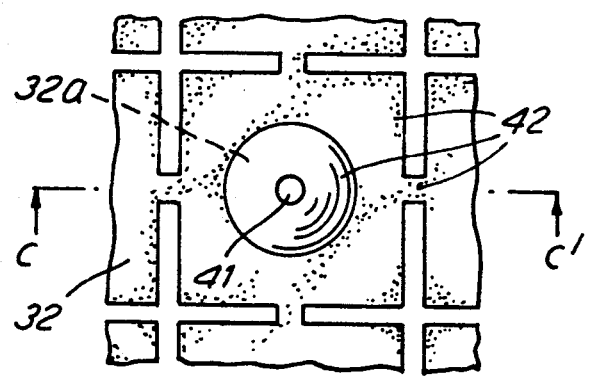
FIG. 6 shows a plan view of part of a surface of a first device in accordance with the invention.
Figure 7:
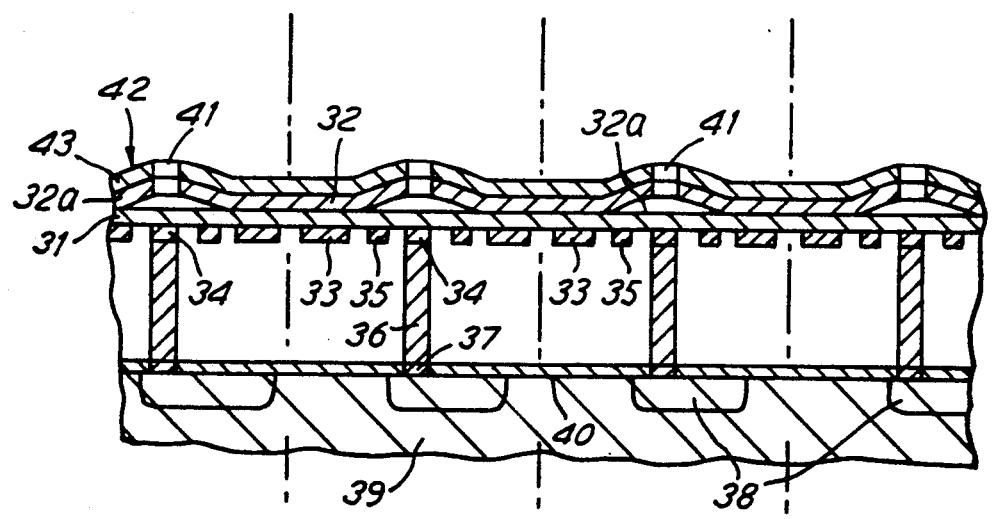
FIG. 7 is a section along the line C—C' of the device shown in FIG. 6.

Referring firstly to FIGS. 6 and 7, the device shown is a modification of the device shown in FIGS. 1-3 described herebefore. A pyroelectric film 31 has an array of interconnected gold electrodes 32 formed on one side and an array of discrete gold electrodes 33 on the other side. Electrically conductive pads 34 are connected by long, thin, coiled conductors 35 to the discrete electrodes 33 and by electrically conductive pillars 36 to input pads 37 of integrated signal processing circuits 38 formed within adjacent regions of a silicon wafer 39. The input pads 37 are separated by regions of a passivating layer 40 of an insulating material carried on the wafer 39. The discrete electrodes 33 are constructed in equivalent manner to those shown in FIG. 1, described hereinbefore. The interconnected electrodes 32, differ from those shown in FIGS. 2 and 3 in that they have extensions 32a which extend over regions of the pyroelectric film 31 carrying the coiled conductors 35 on the other major surface. The extension 32a are spaced from the surface of the pyroelectric film, such that the extensions resemble domes as can be seen in FIGS. 6 and 7. These domes have a central small hole 41 to facilitate fabrication, as will be explained hereafter. The interconnected electrodes 32, together with the extensions 32a carry a layer 42 of an infra-red absorbing material, such as platinum black carried on a platinum layer 43 or any other suitable infra-red absorber such as black gold or a metal-dielectric-metal sandwich structure.

It will be seen that the dome-shaped extensions 32a with their overlying infra-red absorbing layers will intercept radiation in the regions around the pillars carrying the conductors 35, which would otherwise be wasted. By spacing these extensions 32a away from the pyroelectric film 31 the thermal leakage from the absorber to the non-active, i.e. non-electroded areas of the pyroelectric material is minimized.

It will be seen in the arrangement shown in FIGS. 6 and 7 that radiation passing through the hole 41 in the electrode extensions 32a will fall on an unelectroded part of the pyroelectric film. This may be disadvantageous, particularly in an array of very small pyroelectric sensor pixels, as it would result in an appreciable reduction in signal. This problem can be remedied by displacing the holes 41 laterally in the extensions 32a and arranging that the holes 41 overlie an electroded part of the pyroelectric layer.

Turning now to FIGS. 8-11 the interconnected electrodes 32 may be constructed using the following procedure.

Figure 8:
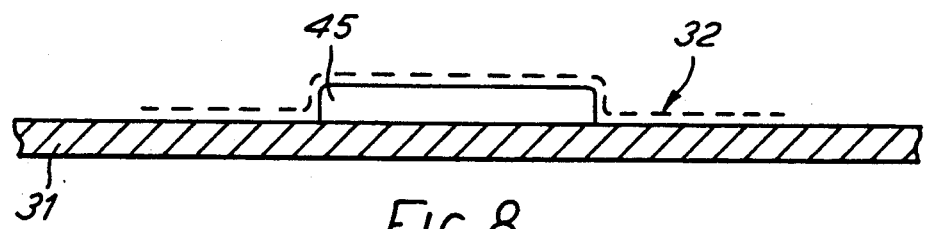
FIG. 8-11 illustrate stages in the manufacture of part of the device shown in FIGS. 6 and 7.
Figure 9:
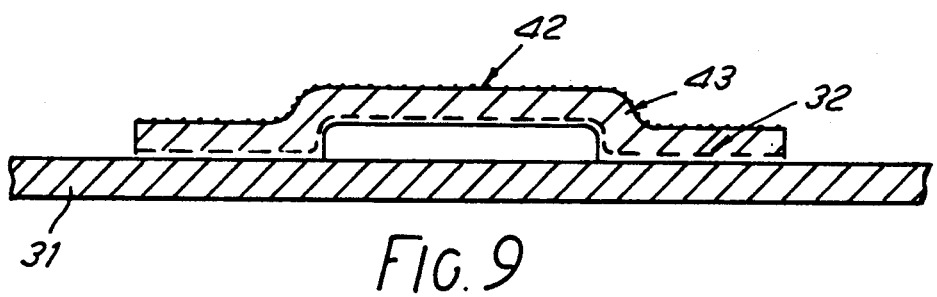

1. Referring firstly to FIG. 8 a layer of aluminum (e.g. 3 microns thick) is evaporated onto the top surface of the pyroelectric film 31 and patterned so as to cover those areas of the film where the interconnected electrodes are extended by inner domes 32a which are spaced apart from the film. Thus an array of aluminum "mold" shapes 45 is formed.

2. A thin gold interconnected electrode pattern 32 (e.g. 0.03 microns thick) is then evaporated onto the top surface of the pyroelectric layer 31 and the aluminum molds 45.

3. A layer 43 of platinum (e.g. 0.1 micron thick) is evaporated onto the gold layer, and then converted partially or totally into a "platinum black" infra-red radiation absorbing surface 42 by standard procedures to produce the structure shown in FIG. 9.

4. A polymer photoresist layer 47 is then deposited over the platinum black surface 42.

Figure 10:
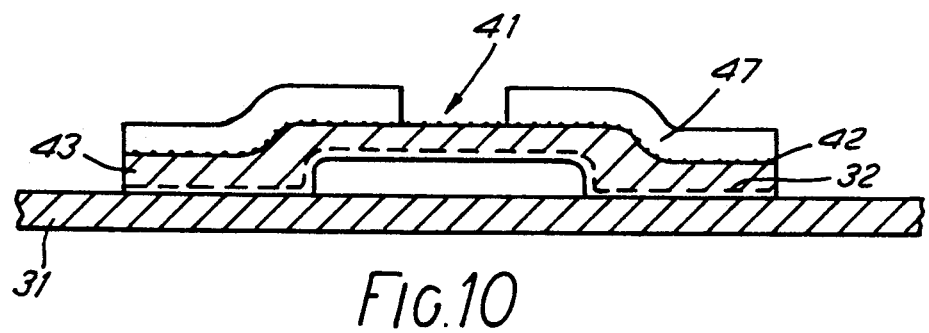
Figure 11:
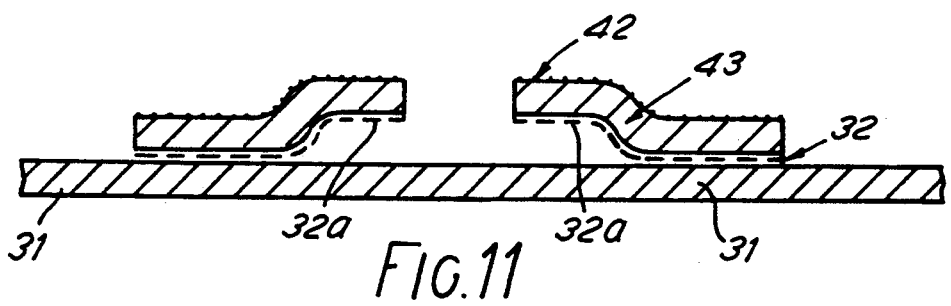

5. A pattern of holes 41 over the central regions of the aluminum discs 45 is produced in the photoresist layer 47 by standard photolithography techniques to provide access to the aluminum molds 45 as shown in FIG. 10

6. The aluminum discs 45 are exposed by plasma etching through the platinum black 42, platinum 43, and gold 32 layers. Plasma etching is chosen as this technique gives fine resolution and straight side walls.

7. The aluminum discs 45 are removed by wet-etching in an acetic acid based solution or other appropriate etchant.

8. Finally, the photoresist is removed, and the top electrode surface rinsed and dried to give the structure shown in FIG. 11.

It will be appreciated that there are many other ways of fabricating the device described including the use of alternative materials. In particular if the gold interconnected electrodes 32 are formed sufficiently thick to possess a low sheet resistance for example less than 10 ohms per square, a thin layer of dielectric material, such as polyimide may be formed on the gold layer. A thin metallic overlayer, having an appropriate sheet resistance, for example 377 ohms per square, may then be deposited on the polyimide layer to form a metal-dielectric-metal infra-red radiation absorbing structure to take the place of the platinum/platinum black combination described herebefore.

Figure 4:
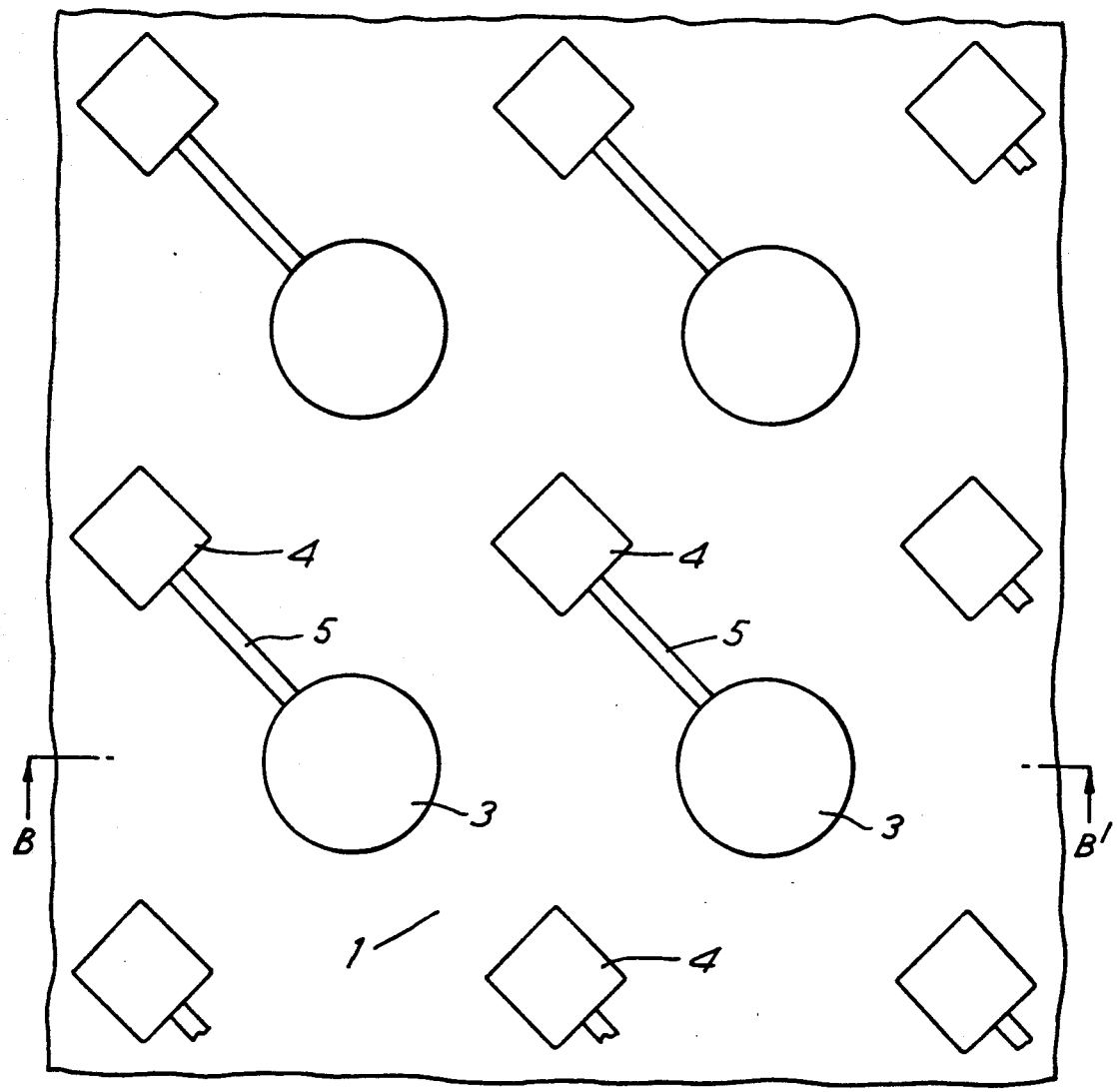
Figure 5:
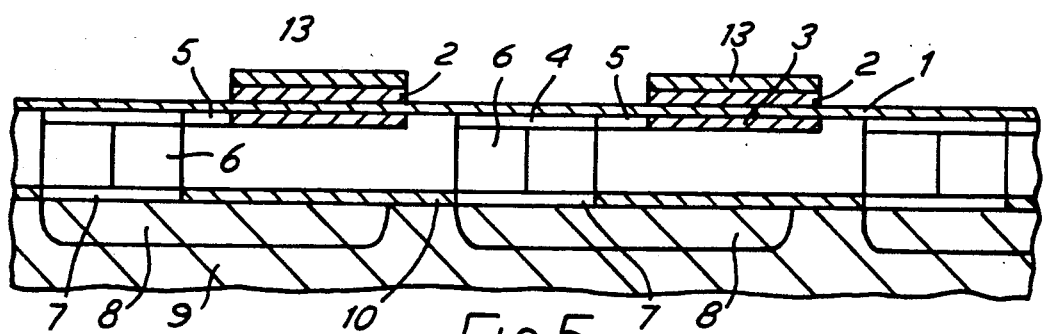

Turning now to FIGS. 12 and 13, the second device in accordance with the invention is an adaptation of that shown in FIGS. 4 and 5, described hereinbefore. A pyroelectric film 51 has an array of interconnected electrodes 52 formed on one side and an array of discrete electrodes 53 formed on the other side.

Electrically conductive pads 54 are connected by long thin conductors 55 to the discrete electrodes 53 and by electrically conductive pillars 56 to input pads 57 of integrated circuitry 58 formed within adjacent regions of a silicon wafer 59, the circuit being effective to process electrical signals produced by the pyroelectric sensor elements. The input pads 57 are, as before separated by regions 60 of an electrically insulating layer.

The interconnected electrodes 52 each carry extensions 52a in the form of an outer rim spaced from the pyroelectric film 51. There is a small gap 61 between the rims of adjacent interconnected electrodes except above the pillars 56 where the electrodes interconnect. The interconnected electrodes 52 and their extensions 52a carry a layer 63 of an infra-red absorbing material such as black gold or platinum black. The second device in accordance with the invention thus performs in an analogous manner to that described in relation to FIGS. 6 and 7 in that the rim shaped extensions 52a of the electrodes 52 with their overlying infra-red absorbant layer 63 intercept radiation in the areas corresponding to the unelectroded regions between the pillars 56 and discrete electrodes 53.

It will be appreciated that the second device in accordance with the invention may be fabricated in a similar manner to that of the first device. One particular method of fabrication would be to use aluminum molds in a general window frame configuration corresponding to the shape of the extensions 52a, in equivalent manner to the aluminum disc shaped molds 45 shown in FIGS. 8 to 10.

We claim:

1. A thermal imaging device comprising a layer of pyroelectric material, the layer having opposed major surfaces; interconnected electroded regions carried on one of the major surfaces for defining an array of interconnected electrodes; electroded and non electroded regions on the other major surface, the electroded regions defining an array of discrete electrodes, the discrete electrodes defining with the interconnected electrodes an array of pyroelectric detector elements; a plurality of pillars, each respective to a detector element, for supporting the layer and for enabling the passage of electrical signals between detector elements and an electrical signal processing means, each pillar being arranged at a position laterally displaced from its respective discrete electrode thereby to support the layer at a non electroded region on the other major surface; a respective plurality of elongate strips of electrically conductive material extending over non electroded regions on the other major surface for providing electrical connections between detector elements and respective laterally displaced pillars; the device further comprising areas of infra-red absorbant material spaced from and extending over regions of said one major surface which overlie non-electroded regions of said other major surface, the areas of infra-red absorbent material being effective to conduct heat from each said region of said one major surface to an adjacent pyroelectric detector element.

2. A thermal imaging device according to claim 1 in which the areas of infra-red absorbant material comprises extensions of the interconnected electrodes.

3. A thermal imaging device according to claim 2 in which the interconnected electrodes and their extensions carry infra-red absorbant layers.

4. A thermal imaging device according to claim 1 in which the layer comprises a pyroelectric film.

5. A device according to claim 1 in which the areas of infra-red absorbant material are formed with apertures effective to ease the fabrication of the device.

6. A thermal imaging device according to claim 1 wherein each discrete electrode comprises an electroded region having a non electroded central region, and each pillar is located at a respective non electroded central region whereby each pillar is laterally disposed from and substantially surrounded by a respective discrete electrode.

7. A thermal imaging device according to claim 1 wherein each discrete electrode comprises an electroded region and each pillar is located at a non electroded region laterally displaced from and not substantially surrounded by a respective discrete electrode.

* * * * *